(12) United States Patent
Uzu et al.

(10) Patent No.: US 10,177,705 B2
(45) Date of Patent: Jan. 8, 2019

(54) COMPOSITE SOLAR CELL, SOLAR CELL MODULE, AND CONCENTRATING SOLAR CELL

(71) Applicant: KANEKA CORPORATION, Osaka-shi, Osaka (JP)

(72) Inventors: Hisashi Uzu, Settsu (JP); Mitsuru Ichikawa, Settsu (JP); Masashi Hino, Settsu (JP); Tomomi Meguro, Settsu (JP); Kenji Yamamoto, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 38 days.

(21) Appl. No.: 15/325,503

(22) PCT Filed: Jul. 10, 2015

(86) PCT No.: PCT/JP2015/069854
§ 371 (c)(1),
(2) Date: Jan. 11, 2017

(87) PCT Pub. No.: WO2016/009956
PCT Pub. Date: Jan. 21, 2016

(65) Prior Publication Data
US 2017/0155358 A1    Jun. 1, 2017

(30) Foreign Application Priority Data

Jul. 12, 2014   (JP) .................... 2014-143758

(51) Int. Cl.
*H02S 40/20*   (2014.01)
*H01G 9/20*    (2006.01)
(Continued)

(52) U.S. Cl.
CPC ............... *H02S 40/20* (2014.12); *G02B 6/00* (2013.01); *H01G 9/2009* (2013.01);
(Continued)

(58) Field of Classification Search
CPC ............................ H02S 40/20; H01G 9/2009
(Continued)

(56) References Cited

U.S. PATENT DOCUMENTS 4,021,267 A * 5/1977 Dettling ............ H01L 31/0543
136/246
4,204,881 A * 5/1980 McGrew ................ G02B 5/32
126/684
(Continued)

FOREIGN PATENT DOCUMENTS

JP   H0766442 A    3/1995
JP   2013096978 A  5/2013
(Continued)

OTHER PUBLICATIONS

International Bureau of WIPO, Notification of Transmittal of Translation of the International Preliminary Report on Patentability Issued in Application No. PCT/JP2015/069854, dated Jan. 26, 2017, WIPO, 7 pages.
(Continued)

*Primary Examiner* — Jayne L Mershon
(74) *Attorney, Agent, or Firm* — Alleman Hall Creasman & Tuttle LLP (57) ABSTRACT

A composite solar cell comprises a spectroscopic element, a first photoelectric conversion element, and a second photoelectric conversion element. The first photoelectric conversion element is positioned in a first direction of the spectroscopic element and the second photoelectric conversion element is positioned in a second direction of the spectroscopic element. The first photoelectric conversion element is a perovskite-type photoelectric conversion element containing, in a light absorbing layer, a perovskite crystal structure material represented by a general formula $R^1NH_3M^1X_3$. A band gap of a light absorbing layer of the second photoelectric conversion element is narrower than the band gap of
(Continued)

the light absorbing layer of the first photoelectric conversion element. The spectroscopic element preferentially outputs the short wavelength light of the incident light in the first direction and preferentially outputs the long wavelength light of the incident light in the second direction.

15 Claims, 5 Drawing Sheets

(51) Int. Cl.
  *G02B 6/00* (2006.01)
  *H01L 51/44* (2006.01)
  *H01L 27/30* (2006.01)
  *H02S 40/22* (2014.01)
(52) U.S. Cl.
  CPC .......... *H01L 27/301* (2013.01); *H01L 51/447* (2013.01); *H02S 40/22* (2014.12); *Y02E 10/52* (2013.01); *Y02E 10/549* (2013.01)
(58) Field of Classification Search
  USPC ........................................................ 136/259
  See application file for complete search history.

(56) References Cited

U.S. PATENT DOCUMENTS

| | | | |
|---|---|---|---|
| 6,015,950 A * | 1/2000 | Converse | H01L 31/0543 126/609 |
| 2005/0051205 A1* | 3/2005 | Mook, Jr. | H01L 31/052 136/255 |
| 2009/0101192 A1* | 4/2009 | Kothari | G02B 5/285 136/246 |
| 2010/0269885 A1* | 10/2010 | Benitez | H01L 31/0543 136/246 |
| 2015/0306845 A1* | 10/2015 | Dollase | B32B 7/12 428/334 |
| 2016/0013434 A1* | 1/2016 | Snaith | H01L 51/4226 136/252 |

FOREIGN PATENT DOCUMENTS

| | | |
|---|---|---|
| JP | 2014072327 A | 4/2014 |
| JP | 2014086601 A | 5/2014 |
| WO | 2013171517 A1 | 11/2013 |

OTHER PUBLICATIONS

Kojima, A. et al., "Organometal Halide Perovskites as Visible-Light Sensitizers for Photovoltaic Cells," Journal of the American Chemical Society, vol. 131, No. 17, May 6, 2009, Published Online Apr. 14, 2009, 2 pages.

Hodes, G., "Perovskite-Based Solar Cells," Science, vol. 342, No. 6156, Oct. 18, 2013, 2 pages.

Hao, F. et al., "Lead-free solid-state organic-inorganic halide perovskite solar cells," Nature Photonics, vol. 8, Jun. 2014, Published Online May 4, 2014, 6 pages.

ISA Japan Patent Office, International Search Report Issued in Application No. PCT/JP2015/069854, dated Sep. 1, 2015, WIPO, 2 pages.

* cited by examiner

COMPOSITE SOLAR CELL, SOLAR CELL MODULE, AND CONCENTRATING SOLAR CELL

TECHNICAL FIELD

The present invention relates to a solar cell including a combination of two or more of photoelectric conversion elements having different bandgaps.

BACKGROUND ART

A solar cell utilizing an organic metal perovskite crystal material (perovskite solar cell) can provide a high conversion efficiency. A large number of reports have recently been published on improvement on conversion efficiency of a solar cell utilizing a perovskite crystal material in a light absorbing layer (e.g., Non-Patent Document 1 and Patent Document 1). The organic metal used is a compound represented by a general formula $R^1NH_3M^1X_3$ (where $R^1$ is an alkyl group, $M^1$ is a divalent metal ion, and X is a halogen). Spectral sensitivity characteristics of the compound are known to vary depending on the halogen and/or the ratio of the halogen (e.g., Non-Patent Document 2).

A perovskite crystal material, such as $CH_3NH_3PbX_3$ (X: halogen), can be used to form a thin-film at low cost using a solution application technique, such as spin coating. Thus, attention has been directed to a perovskite solar cell utilizing such a perovskite crystal material, as a low-cost and high-efficiency next generation solar cell. Furthermore, a perovskite solar cell has also been developed that incorporates, as a light absorbing material, $CH_3NH_3SnX_3$ containing tin in place of lead (e.g., Non-Patent Document 3).

Figure 8:
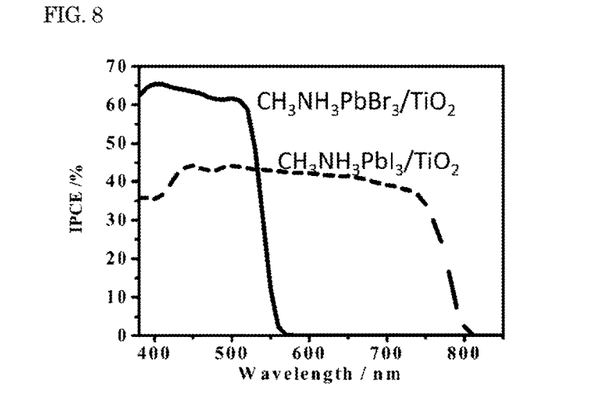
FIG. 8 is a graph showing spectral sensitivity characteristics of a perovskite crystal structure compound.

As shown in FIG. 8 (see Non-Patent Document 2), a perovskite crystal material exhibits a spectral sensitivity characteristic that is dramatically reduced at a wavelength of 800 nm, and thus absorbs little infrared light having wavelengths greater than 800 nm. Thus, to improve efficiency of a perovskite solar cell, it is important to effectively use long-wavelength light. For example, a combination of a perovskite solar cell and a solar cell having a bandgap narrower than that of the perovskite solar cell allows long-wavelength light to be used by the solar cell having a narrower bandgap. This is thought to achieve a solar cell with higher efficiency.

One known solar cell including a combination of multiple photoelectric conversion elements is a tandem solar cell, which is a stack of photoelectric conversion elements having different bandgaps. A tandem solar cell includes a photoelectric conversion element (front cell) having a wider bandgap provided on a light incident side, and a photoelectric conversion element (rear cell) having a narrower bandgap provided at the back side of the front cell. Since multiple photoelectric conversion elements are connected in series in the tandem photoelectric conversion element, effective drawing of photocurrents generated in the photoelectric conversion elements demands that the magnitude of photocurrents generated in each of the photoelectric conversion elements be identical.

In addition, a method has been proposed in which multiple photoelectric conversion elements having different bandgaps are disposed spatially spaced apart from each other, where a photoelectric conversion element having a narrower bandgap receives long-wavelength light, while a photoelectric conversion element having a wider bandgap receives short-wavelength light (e.g., Patent Document 2). This method eliminates the need for photocurrent matching from the multiple photoelectric conversion elements, thereby offers higher flexibility in design.

PRIOR ART DOCUMENTS

Patent Documents

Patent Document 1: JP 2014-72327 A
Patent Document 2: JP 1107-66442 A

Non-Patent Documents

Non Patent Document 1: G. Hodes, *Science,* 342, 317-318 (2013).
Non Patent Document 2: A. Kojima et. al., *J Am. Chem. Soc.,* 131, 6050-6051 (2009).
Non Patent Document 3: F. Hao et al., *Nat. Photonics,* 8, 489-494 (2014).

SUMMARY OF THE INVENTION

Problems to be Solved by the Invention

A composite solar cell including a combination of a perovskite-type photoelectric conversion element and another type of photoelectric conversion element has rarely been reported previously. Thus, there are currently no useful findings for effectively utilizing long-wavelength light by means of a combination of a perovskite-type photoelectric conversion element and another type of photoelectric conversion element.

In view of the foregoing, an object of the present invention is to provide a high-efficiency solar cell including a combination of a perovskite-type photoelectric conversion element and another type of photoelectric conversion element.

Means for Solving the Problem

A solar cell according to the present invention is a composite solar cell including a spectroscopic element, a first photoelectric conversion element, and a second photoelectric conversion element. The first photoelectric conversion element is provided at a position in a first direction of the spectroscopic element. The second photoelectric conversion element is provided at a position in a second direction of the spectroscopic element. The first photoelectric conversion element is a perovskite-type photoelectric conversion element, and contains, in a light absorbing layer, a perovskite crystal material represented by a general formula $R^1NH_3M^1X_3$.

In the second photoelectric conversion element, the light absorbing layer has a bandgap narrower than the bandgap of the light absorbing layer of the first photoelectric conversion element. In other words, the second photoelectric conversion element serves as a solar cell capable of utilizing light having a longer wavelength than the wavelengths of light that can be utilized by a perovskite-type photoelectric conversion element. Examples of the material of the light absorbing layer of the second photoelectric conversion element include crystalline silicon (single crystalline, polycrystalline, or microcrystalline silicon) and chalcopyrite-based compounds such as $CuInSe_2$ (CIS).

A spectroscopic element changes the propagation direction of incident light depending on the wavelength thereof by using phenomena such as reflection, refraction, diffraction, interference, and/or polarization of light. The spectroscopic element may be, for example, a lens, a prism, a diffraction grating, a wavelength-selective reflection element (e.g., dichroic mirror or dichroic prism), or a combination thereof. Such spectroscopic element outputs short-wavelength light of the incident light predominantly in the first direction (toward the first photoelectric conversion element), and long-wavelength light of the incident light predominantly in the second direction (toward the second photoelectric conversion element).

As used herein, the phrase "output light predominantly in the first direction" is intended to mean that, of incident light having a particular wavelength $\lambda_A$, the amount of light output in the first direction is greater than the amount of light output in the second direction. Similarly, the phrase "output light predominantly in the second direction" is intended to mean that, of incident light having a particular wavelength $\lambda_B$, the amount of light output in the second direction is greater than the amount of light output in the first direction.

The wavelength range of the light output by the spectroscopic element predominantly in the first direction, and the wavelength range of the light output by the spectroscopic element predominantly in the second direction, are determined depending on spectral sensitivity characteristics of the perovskite-type photoelectric conversion element, which is the first photoelectric conversion element. More specifically, it is preferable that, of the incident light received by the spectroscopic element from the light incident side, light having an energy of $(E_1+0.9)$ eV or more be output predominantly in the first direction, while light having an energy of $(E_1+0.3)$ eV or less be output predominantly in the second direction. Here, the light energy corresponding to the long-wavelength edge of a spectral sensitivity curve of the light absorbing layer (perovskite crystal) of the first photoelectric conversion element is taken as $E_1$ eV. The phrase "long-wavelength edge of a spectral sensitivity curve" is intended to mean a wavelength at which spectral sensitivity (incident photon to current conversion efficiency; IPCE) decreases below 1%, when the IPCE is measured with changing measurement wavelengths from short wavelength to longer wavelength.

When the long-wavelength edge of a spectral sensitivity curve of the light absorbing layer of the first photoelectric conversion element is in a range from 750 nm to 850 nm (1.65 eV to 1.46 eV), the spectroscopic element preferably outputs, of the incident light, light having wavelengths of 500 nm or less (2.5 eV or more) predominantly in the first direction, and light having wavelengths of 650 nm or longer (1.91 eV or less) predominantly in the second direction.

In one aspect of the present invention, the composite solar cell is preferably configured to prevent ultraviolet (UV) light having wavelengths from 300 nm to 320 nm from entering the first photoelectric conversion element. More specifically, the composite solar cell is preferably configured such that 50% or more of light having wavelengths from 300 nm to 320 nm, of the incident light, is prevented from entering the first photoelectric conversion element. In this aspect, the spectroscopic element may be configured such that light having wavelengths from 300 nm to 320 nm predominantly enters the second photoelectric conversion element. The spectroscopic element may be configured such that light having wavelengths from 300 nm to 320 nm predominantly enters a third photoelectric conversion element.

The present invention also relates to a solar cell module. A solar cell module according to the present invention is formed by encapsulating the composite solar cell described above. A perovskite crystal material formed of an organic metal is less stable to moisture than inorganic materials such as silicon. Therefore, at least the first photoelectric conversion element (perovskite-type photoelectric conversion element) is preferably encapsulated. The entire composite solar cell may be encapsulated.

A concentrating solar cell can be formed by combining a composite solar cell according to the present invention with appropriate light condensing means. A collimating element may be provided between the light condensing means and the spectroscopic element of the composite solar cell. Collimation of the light condensed by the light condensing element before the light enters the spectroscopic element enables the propagation direction of the light output from the spectroscopic element to be suitably controlled.

Effects of the Invention

The present invention uses a combination of a perovskite-type photoelectric conversion element and another type of photoelectric conversion element, and adjusts, by means of the spectroscopic element, the wavelength ranges of the light predominantly incident on the respective photoelectric conversion elements. Thus, a high-efficiency composite solar cell in which light is effectively utilized in each of the photoelectric conversion elements can be obtained.

DESCRIPTION OF EMBODIMENTS

Figure 1:
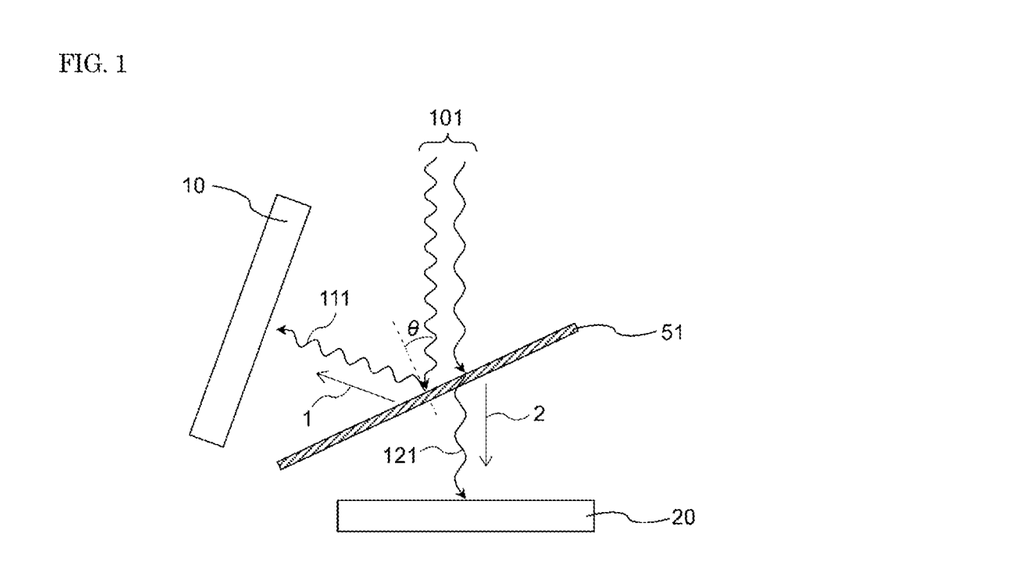
FIG. 1 is a schematic view illustrating a configuration of a composite solar cell according to one embodiment.

FIG. 1 is a schematic view illustrating a configuration of a composite solar cell according to one embodiment. The composite solar cell includes a spectroscopic element 51, a first photoelectric conversion element 10, and a second photoelectric conversion element 20. The first photoelectric conversion element 10 is a perovskite-type photoelectric conversion element. The second photoelectric conversion element 20 is a photoelectric conversion element having a bandgap narrower than the bandgap of the first photoelectric conversion element.

In a composite solar cell according to the present invention, light 101, such as sunlight, enters the spectroscopic element 51, and then light output from the spectroscopic element enters the photoelectric conversion elements 10 and 20. In the configuration illustrated in FIG. 1, the spectroscopic element 51 is a wavelength-selective reflection film that transmits long-wavelength light and reflects short-wavelength light. Short-wavelength light of the light 101 received by the wavelength-selective reflection film 51 from the light incident side at an incident angle θ (incident angle is an angle between the normal direction of the film surface of the spectroscopic element and the light incident direction) is reflected by the wavelength-selective reflection film 51. The reflected light 111 is output in a first direction 1. Long-wavelength light of the light 101 is transmitted through the wavelength-selective reflection film 51. The transmitted light 121 is output in a second direction 2.

The first photoelectric conversion element 10 is disposed in the first direction (light reflection direction) of the spectroscopic element 51. Thus, the output light 111 (reflected light) from the spectroscopic element (wavelength-selective reflection film) 51 enters the first photoelectric conversion element 10. The second photoelectric conversion element 20 is disposed in the second direction (light transmission direction) of the spectroscopic element 51. Thus, the output light 121 (transmitted light) from the spectroscopic element (wavelength-selective reflection film) 51 enters the second photoelectric conversion element 20.

The composite solar cell of FIG. 1 includes the spectroscopic element 51, thereby outputs short-wavelength light (high energy light) predominantly in the first direction 1 to allow the short-wavelength light to enter the perovskite-type photoelectric conversion element 10, which is the first photoelectric conversion element. Long-wavelength light (low energy light) is output predominantly in the second direction 2 to enter the narrow-bandgap photoelectric conversion element 20, which is the second photoelectric conversion element. This enables both long-wavelength light and short-wavelength light to be effectively utilized.

A perovskite-type photoelectric conversion element has excellent spectral sensitivity for short-wavelength light having a wavelength of about 400 nm. Therefore, the configuration that allows short-wavelength light to predominantly enter the perovskite-type photoelectric conversion element, and allows long-wavelength light unabsorbable by a perovskite compound to predominantly enter the narrow bandgap photoelectric conversion element is highly advantageous in improving efficiency of a composite solar cell including a perovskite-type photoelectric conversion element.

Furthermore, even if the photocurrents of the first photoelectric conversion element 10 and the second photoelectric conversion element are different, lower photocurrent value is not a rate limiting factor of the total photocurrent in the composite solar cell. Therefore, the amount of electrical loss is smaller than the amount when a plurality of photoelectric conversion elements are stacked, and the conversion efficiency can thus be improved. A tandem solar cell, which is formed of a stack of a plurality of photoelectric conversion elements, includes a wide bandgap cell as the top cell on the light incident side, and thus long-wavelength light including infrared light first enters the top cell. Therefore, a temperature of the top cell easily rises. Since a perovskite crystal material formed of an organic metal is less heat resistant than inorganic materials such as silicon, degradation of characteristics due to heat is of concern for a tandem solar cell including a perovskite element as the top cell. In contrast, a composite solar cell according to the present invention selectively allows short-wavelength light to enter the first photoelectric conversion element (perovskite-type photoelectric conversion element) having a wide bandgap. Therefore, the temperature rise of the perovskite-type photoelectric conversion element is reduced to suppress degradation of characteristics due to heat.

Furthermore, the present inventors have studied and found that when a portion of light having wavelengths shorter than the long-wavelength edge $\lambda_E$ of the spectral sensitivity curve of the perovskite crystal material, which forms the light absorbing layer of the first photoelectric conversion element 10, is allowed to predominantly enter the narrow bandgap second photoelectric conversion element 20, the temperature rise of the perovskite-type photoelectric conversion element is further reduced, and at the same time, efficiency can be further improved.

The optimum value for the wavelength range of the light that should be allowed to predominantly enter the first photoelectric conversion element 10, and the optimum value for the wavelength range of the light that should be allowed to predominantly enter the second photoelectric conversion element 20 depend on the spectral sensitivity characteristic of the perovskite crystal material. These wavelength ranges can be determined based on the long-wavelength edge $\lambda_E$ of the spectral sensitivity curve. Light having an energy of $(E_1+0.3)$ eV or less is preferably allowed to predominantly enter the second photoelectric conversion element 20 (narrow bandgap photoelectric conversion element); and light having an energy of $(E_1+0.9)$ eV or more is preferably allowed to predominantly enter the first photoelectric conversion element (perovskite-type photoelectric conversion element) 10. Herein, $E_1$ (eV) is a light energy corresponding to the long-wavelength edge $\lambda_E$ of the spectral sensitivity curve of the perovskite crystal material that forms the light absorbing layer of the first photoelectric conversion element.

The spectroscopic element 51 is preferably configured to change the propagation direction of the incident light depending on the wavelength thereof as described above. Specifically, the spectroscopic element 51 preferably outputs short-wavelength light having an energy of $(E_1+0.9)$ eV or more predominantly in the first direction 1, and outputs long-wavelength light having an energy of $(E_1+0.3)$ eV or less predominantly in the second direction 2, of the incident light received from the light incident side. In this case, light having an energy more than $(E_1+0.3)$ eV and less than $(E_1+0.9)$ eV may be output predominantly in either the first direction or the second direction; or may be output in substantially the same amount in the first and second directions.

For example, a perovskite crystal material of $CH_3NH_3PbI_3$ has a long-wavelength edge $\lambda_E$ of the spectral sensitivity curve of about 800 nm, and the light energy equivalent thereto is 1.55 eV. When the light absorbing layer of the first photoelectric conversion element 10 contains a perovskite crystal material of $CH_3NH_3PbI_3$, the spectroscopic element 51 is preferably configured such that light having wavelengths shorter than 500 nm is output predominantly in the first direction 1 (toward the first photoelectric conversion element 10), and light having wavelengths greater than 670 nm is output predominantly in the second direction 2 (toward the second photoelectric conversion element 20).

For example, when the long-wavelength edge $\lambda_E$ of the spectral sensitivity curve of the light absorbing layer of the first photoelectric conversion element 10 is in a range from 750 nm to 850 nm, the spectroscopic element 51 is preferably configured to output short-wavelength light having wavelengths of 500 nm or shorter predominantly in the first direction 1, and to output long-wavelength light having wavelengths of 650 nm or more predominantly in the second direction 2, of the incident light received from the light incident side.

The phrase "output predominantly in a particular direction" is intended to mean that the amount of light output in that direction, of the incident light in a particular wavelength range, is greater than the amount of light that is output in other directions. Light being output predominantly in the first direction means preferably more than 50% of the incident light in that particular wavelength range is allowed to enter the first photoelectric conversion element. The amount of light entering the first photoelectric conversion element is more preferably 70% or more, further preferably 80% or more, and particularly preferably 90% or more. Similarly, light being output predominantly in the second direction means preferably 50% or more, more preferably 70% or more, further preferably 80% or more, and particularly preferably 90% or more of the incident light in that particular wavelength range is allowed to enter the second photoelectric conversion element 20.

Such spectral characteristic can be suitably adjusted using, for example, the configuration of the spectroscopic element 51, the relative positional relationships between the spectroscopic element 51 and the photoelectric conversion elements 10 and 20, and the positioning angle of the spectroscopic element 51 relative to the light incident direction. For example, the configuration shown in FIG. 1 employs, as the spectroscopic element 51, a wavelength-selective reflection film that predominantly reflects light having wavelengths shorter than a separation wavelength $\lambda_1$ (high energy light), and predominantly transmits light having wavelengths longer than $\lambda_1$ (low energy light). The separation wavelength $\lambda_1$ corresponds to an energy of from $(E_1+0.3)$ to $(E_1+0.9)$ eV, and is in a range of, for example, from 500 nm to 650 nm. The wavelength-selective reflection film is typically a vapor-deposited multilayer thin-film formed of dielectric materials having different refractive indices. Wavelength-selective reflection films (dichroic mirrors) having various separation wavelengths are commercially available.

The incident angle θ of the incident light 101 incident on the wavelength-selective reflection film 51 is not particularly limited. A smaller value of θ results in a smaller reflectance at a boundary with air, and thus results in a higher transmittance with respect to the long-wavelength light in the second direction, accordingly allowing a larger amount of long-wavelength light to enter the second photoelectric conversion element 20. As such, the incident angle θ is preferably 40° or less, more preferably 30° or less, and further preferably 25° or less. On the other hand, an excessively small θ means that the light incident direction and the first direction are substantially parallel to each other. In this case, the incident light may be prevented from reaching the wavelength-selective reflection film 51. Thus, the incident angle θ is preferably 5° or more, and more preferably 10° or more.

When the wavelength-selective reflection film is a multilayer thin-film, the separation wavelength shifts to shorter wavelengths (blue shift) as the incident angle θ increases. Therefore, the configuration of the spectroscopic element is desirably determined in consideration of the incident angle θ. Although the configuration shown in FIG. 1 includes a wavelength-selective reflection film that reflects short-wavelength light and transmits long-wavelength light, a wavelength-selective reflection film that transmits short-wavelength light and reflects long-wavelength light may be used. In such case, the light transmission direction is the first direction, and the light reflection direction is the second direction.

Figure 2:
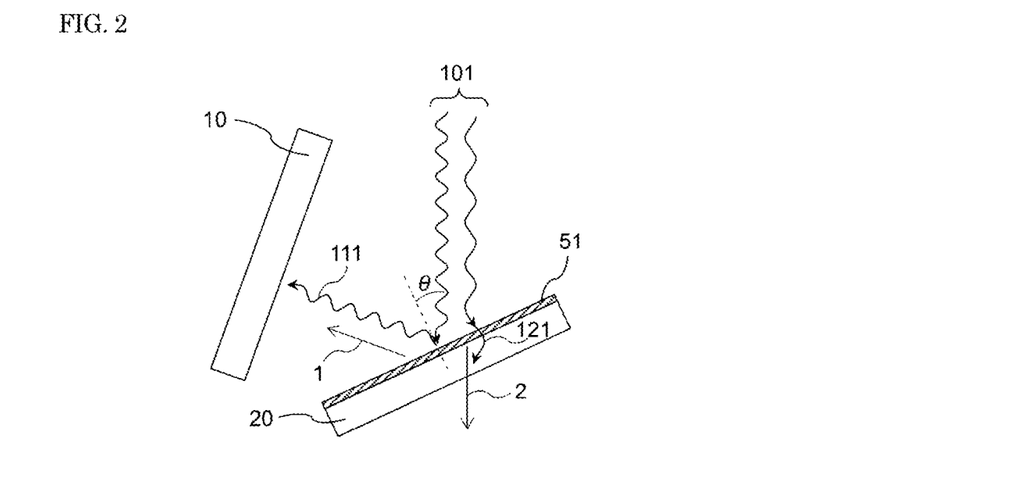
FIG. 2 is a schematic view illustrating a configuration of a composite solar cell according to one embodiment.

Although the configuration shown in FIG. 1 includes the spectroscopic element 51 that is disposed spatially spaced apart from the photoelectric conversion elements 10 and 20, the spectroscopic element and the photoelectric conversion elements may be disposed close to, or in contact with, each other. For example, in the configuration shown in FIG. 2, the wavelength-selective reflection film 51 is provided, as the spectroscopic element, in contact with the second photoelectric conversion element 20. Also in this configuration, short-wavelength light of the incident light 101 received by the spectroscopic element 51 is reflected in the first direction, and the reflected light 111 enters the first photoelectric conversion element 10; and long-wavelength light of the incident light 101 received by the spectroscopic element 51 is transmitted in the second direction, and the transmitted light 121 enters the second photoelectric conversion element 20.

The spectroscopic element is not limited to a wavelength-selective reflection film, but may be various optical elements that change the propagation direction of incident light depending on the wavelength thereof by using phenomena such as reflection, refraction, diffraction, interference, and/or polarization of light. More specifically, a suitable combination, as needed, of a lens, a prism, a diffraction grating, a mirror, a polarized beam splitter (e.g., one that utilizes total reflection at a Brewster's angle), and/or the like can provide a spectroscopic element that outputs short-wavelength light predominantly in the first direction (toward the first photoelectric conversion element), and outputs long-wavelength light predominantly in the second direction (toward the second photoelectric conversion element).

Figure 3:
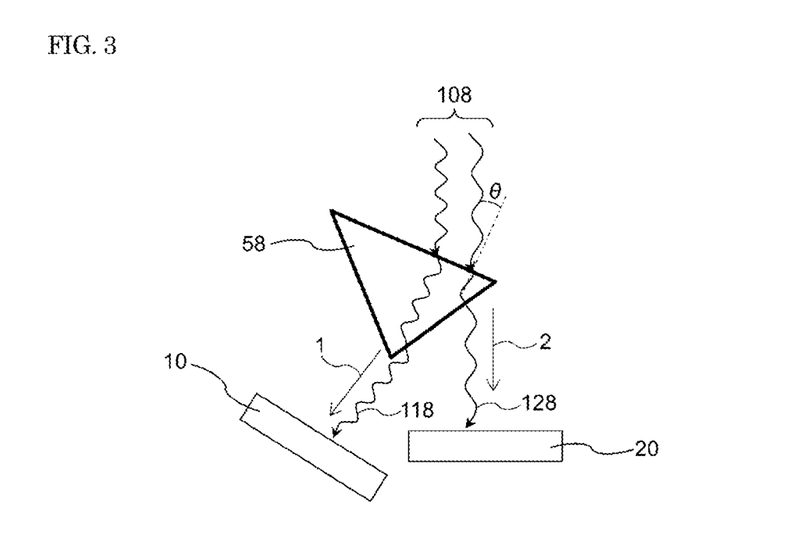
FIG. 3 is a schematic view illustrating a configuration of a composite solar cell according to one embodiment.

FIG. 3 schematically illustrates an example of the configuration of the composite solar cell including a prism 58 as the spectroscopic element. In the configuration of FIG. 3, light 108 received by the prism 58 is refracted when the light 108 enters the prism and exits from the prism. The material that forms the prism has a wavelength-dependent refractive index (typically, the refractive index increases as the wavelength decreases). Thus, the direction of the light output from the prism varies depending on the wavelength thereof. Accordingly, disposing the first photoelectric conversion element 10 in the outgoing direction of short-wavelength light (first direction 1), and disposing the second photoelectric conversion element 20 in the outgoing direction of long-wavelength light (second direction 2), can achieve a composite solar cell according to the present invention. Adjustment of the material and/or shape of the prism, of the incident angle of the light 108 on the prism 58, and/or of the positional relationships between the prism 58 and the photoelectric conversion elements 10 and 20 permits the wavelength range of the light output predominantly toward the first photoelectric conversion element 10, and the wavelength range of the light output predominantly toward the second photoelectric conversion element 20 to be adjusted to fall within a desired range. Using a plurality of prisms in combination (e.g., a dichroic prism) can also improve the separation accuracy of wavelength ranges, and the accuracy of propagation direction of output light.

Figure 4A:
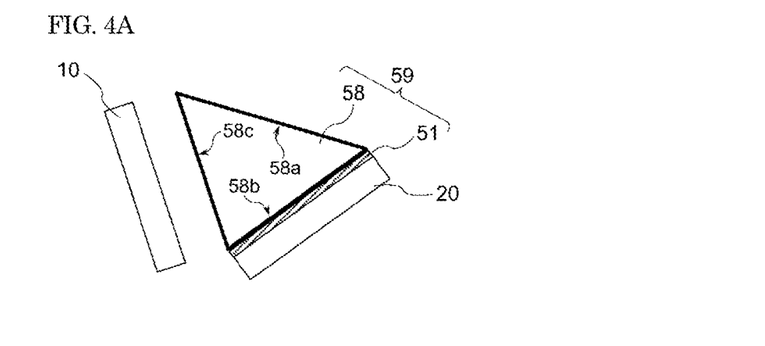
FIG. 4A is a schematic view illustrating a configuration of a composite solar cell according to one embodiment.
Figure 4B:
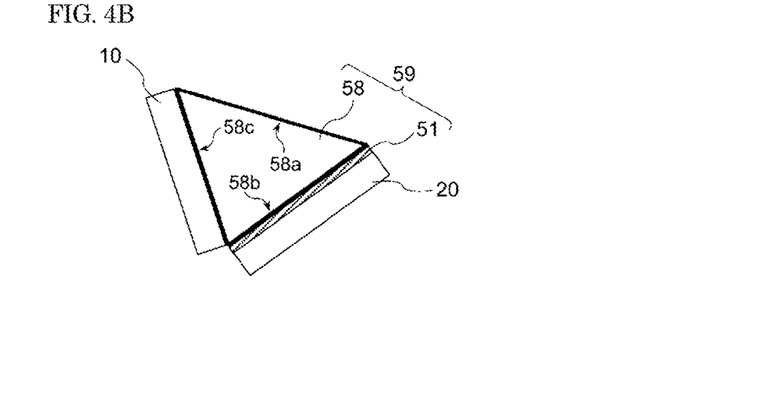
FIG. 4B is a schematic view illustrating a configuration of a composite solar cell according to one embodiment.

FIGS. 4A and 4B each schematically illustrate an example of the configuration of a composite solar cell that includes a combination of a prism 58 and a wavelength-selective reflection film 51, as a composite spectroscopic element 59. In the configuration of FIG. 4A, the wavelength-selective reflection film 51 is disposed in contact with a surface 58*b* of the prism 58. The incident light received by a surface 58a of the prism 58 is refracted at the boundary, is output from the surface 58b, and then reaches the wavelength-selective reflection film 51. Of the light reaching the wavelength-selective reflection film 51, short-wavelength light is reflected in the first direction, is output from a surface 58c of the prism 58, and then enters the first photoelectric conversion element 10. Of the light reaching the wavelength-selective reflection film 51, long-wavelength light is transmitted in the second direction, and then enters the second photoelectric conversion element 20 disposed in contact with the wavelength-selective reflection film 51. The configuration of FIG. 4B is similar or identical to the configuration of FIG. 4A except that the first photoelectric conversion element 10 is provided in contact with the surface 58c of the prism 58.

As described above, disposing multiple optical elements of the composite spectroscopic element in contact with each other can reduce optical losses due to reflection and/or refraction at the boundary between the optical elements. Moreover, disposing the spectroscopic element and one or more of the photoelectric conversion elements in contact with each other can further reduce the optical loss. This can increase the amount of light incident on the photoelectric conversion element(s), and can thus improve the conversion efficiency of the composite solar cell. For example, in the configuration of FIG. 4B, providing the first photoelectric conversion element 10 in contact with the surface 58c of the prism 58 enables the optical loss to be further reduced as compared to the configuration of FIG. 4A. Furthermore, integration of multiple elements can reduce the number of points that require sealing when the composite solar cell is to be encapsulated. This can improve production efficiency of the composite solar cell.

In the configurations shown in FIGS. 4A and 4B, the wavelength-selective reflection film 51, which reflects short-wavelength light and transmits long-wavelength light, and the second photoelectric conversion element 20 are provided in contact with the surface 58b of the prism 58. A wavelength-selective reflection film that reflects long-wavelength light and transmits short-wavelength light may be used instead. In this case, the first photoelectric conversion element is provided in contact with the wavelength-selective reflection film.

The first photoelectric conversion element 10 contains a photosensitive material having a perovskite crystal structure (perovskite crystal material) in the light absorbing layer. The compound that forms a perovskite crystal material is represented by a general formula $R^1NH_3M^1X_3$, where $R^1$ is an alkyl group, preferably an alkyl group having 1 to 5 carbon atoms, and particularly preferably a methyl group; $M^1$ is a divalent metal ion, and preferably Pb or Sn; and X is a halogen, such as F, Cl, Br, or I. The three elements X may be a same halogen element, or a mixture of different halogen elements. Changing halogens and/or a ratio between halogens can change the spectral sensitivity characteristics.

The configuration of the first photoelectric conversion element (perovskite-type photoelectric conversion element) may be any suitable configuration, such as the configuration disclosed in Patent Document 1 or Non-Patent Document 1, 2, or 3 described above. For example, the first photoelectric conversion element may have a structure including, in order from the light receiving surface, a transparent substrate; a transparent electrode layer; a blocking layer formed of a material such as $TiO_2$; a light absorbing layer having a perovskite crystal material formed on a surface of a porous carrier formed of a metal oxide, such as $TiO_2$ or $Al_2O_2$; a hole transport layer; and a metal electrode layer.

The configuration of the second photoelectric conversion element 20 is not particularly limited as long as the bandgap of the light absorbing layer thereof is narrower than the bandgap of the light absorbing layer of the first photoelectric conversion element. Examples of material for the light absorbing layer that satisfies such condition include crystalline silicon, gallium arsenide (GaAs), and $CuInSe_2$ (CIS). Among these, crystalline silicon and CIS are preferably used in view of high utilization efficiency of long-wavelength light (particularly infrared light having wavelengths of 1000 nm or longer). Crystalline silicon may be single crystalline, polycrystalline, or microcrystalline. In particular, due to high utilization efficiency of long-wavelength light and excellent carrier collection efficiency, a photoelectric conversion element having a single-crystalline silicon substrate as the light absorbing layer is preferably used.

Examples of photoelectric conversion element having a single-crystalline silicon substrate include one in which an n-type layer is provided on the light receiving side, and a highly doped region (p+ region) is provided on the rear side, of a p-type single-crystalline silicon substrate; and one in which an amorphous silicon layer and a transparent electrically-conductive layer are provided on each side of a p-type or n-type single-crystalline silicon substrate (heterojunction crystalline silicon solar cell). Note that the configuration, the material(s), and other features of the second photoelectric conversion element are not limited to what have been exemplified above as long as long-wavelength light predominantly entering the second photoelectric conversion element can be effectively utilized.

It is known that the perovskite crystal material that forms the light absorbing layer of the first photoelectric conversion element 10 undergoes characteristics change and thus is degraded by UV irradiation. Accordingly, the amount of UV light incident on the first photoelectric conversion element 10 is preferably small to obtain a highly reliable composite solar cell. More specifically, it is preferred that the amount of UV light having wavelengths in a range from 300 nm to 320 nm of the light incident on the first photoelectric conversion element be small. For example, the spectroscopic element can be configured such that 50% or more of the UV light having wavelengths in a range from 300 nm to 320 nm of the incident light is prevented from entering the first photoelectric conversion element. Moreover, reduction in the amount of UV light incident on the first photoelectric conversion element can not only suppress photodegradation of the perovskite-type photoelectric conversion element, but also suppress a temperature rise, which can, in turn, suppress reduce degradation of characteristics due to heat.

One possible solution for preventing UV light having wavelengths in a range from 300 nm to 320 nm from entering the first photoelectric conversion element is, for example, using a combination of a wavelength-selective reflection film and a UV absorbing element, as the spectroscopic element. More specifically, in the configuration of FIG. 1, disposing a UV absorbing element (not shown) between the wavelength-selective reflection film 51 and the first photoelectric conversion element 10 can reduce the amount of UV light incident on the first photoelectric conversion element. The UV absorbing element preferably has a transmittance of less than 50% with respect to light having wavelengths in a range from 300 nm to 320 nm.

Instead of using a UV absorbing element, the spectroscopic element may be configured such that UV light having wavelengths in a range from 300 nm to 320 nm is predominantly output to the second photoelectric conversion element. For example, the composite solar cell can include, as the spectroscopic element, a wavelength-selective reflection film that wavelength-selectively reflects light having wavelengths from $\lambda_2$ to $\lambda_1$ (where $\lambda_2<\lambda_1$), and wavelength-selectively transmits light having wavelengths shorter than $\lambda_2$ and light having wavelengths longer than $\lambda_1$.

Figure 5:
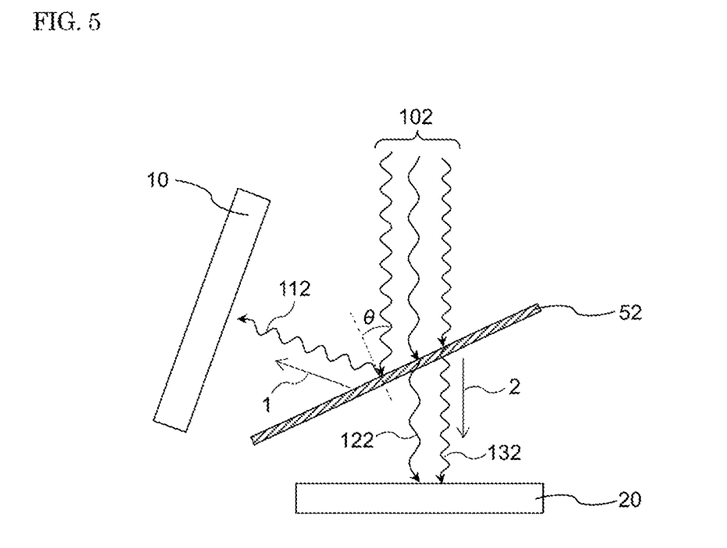
FIG. 5 is a schematic view illustrating a configuration of a composite solar cell according to one embodiment.

FIG. 5 is a schematic view illustrating an example of the configuration of a composite solar cell including a wavelength-selective reflection film 52 that wavelength-selectively reflects light having wavelengths from $\lambda_2$ to $\lambda_1$. Of the incident light received by the wavelength-selective reflection film 52, light having wavelengths in a range from $\lambda_2$ to $\lambda_1$ is predominantly reflected in the first direction 1, and the reflected light 112 enters the first photoelectric conversion element 10, while light having wavelengths longer than $\lambda_1$ and light having wavelengths shorter than $\lambda_2$ (UV light) are transmitted through the wavelength-selective reflection film 52, and is output predominantly in the second direction 2. The transmitted long-wavelength light 122 and the transmitted UV light 132 enter the second photoelectric conversion element 20.

As described above, using as the spectroscopic element a wavelength-selective reflection film 52 having two or more separation wavelengths can reduce the amount of UV light incident on the first photoelectric conversion element, and can thus reduce photodegradation. Moreover, the UV light that would otherwise have been output toward the first photoelectric conversion element can be utilized in the second photoelectric conversion element. This achieves a highly reliable composite solar cell with high conversion efficiency.

The range of the long-wavelength separation wavelength $\lambda_1$ of the wavelength-selective reflection film is similar or identical to what have been described in relation to the configuration shown in FIG. 1. The short-wavelength separation wavelength $\lambda_2$ can be 320 nm or longer. However, a high $\lambda_2$ may cause only a small amount of short-wavelength light to be available in the first photoelectric conversion element, and may thus lower the conversion efficiency. Thus, $\lambda_2$ is preferably 400 nm or shorter, more preferably 370 nm or shorter, and further preferably 350 nm or shorter.

Figure 6:
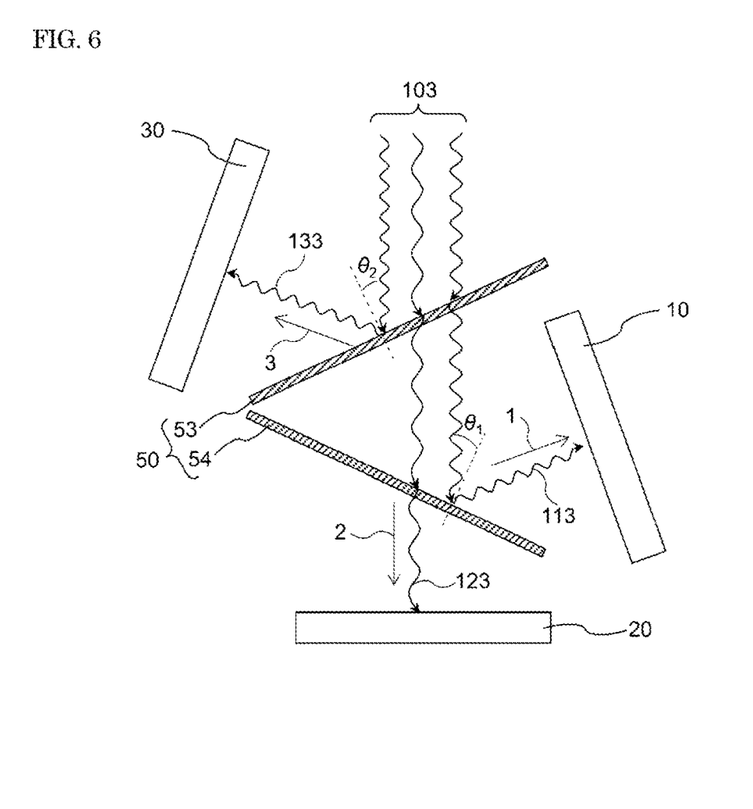
FIG. 6 is a schematic view illustrating a configuration of a composite solar cell according to one embodiment.

The composite solar cell illustrated in FIG. 6 includes a third photoelectric conversion element 30 in a third direction of the spectroscopic element 50. In this configuration, of the incident light received by the spectroscopic element 50, UV light having wavelengths in a range from 300 nm to 320 nm is output predominantly in the third direction, and the reflected light then enters the third photoelectric conversion element. Using as the third photoelectric conversion element 30 a conversion element having utilization efficiency of UV light higher than that achieved by the second photoelectric conversion element will further improve the conversion efficiency. Examples of preferred material used in the light absorbing layer of the third photoelectric conversion element 30 include amorphous silicon and wide bandgap materials, such as CdTe.

In the configuration illustrated in FIG. 6, the spectroscopic element 50 includes a plurality of wavelength-selective reflection films having different separation wavelengths. For example, a wavelength-selective reflection film 53 wavelength-selectively reflects light having wavelengths shorter than $\lambda_2$ to allow the reflected light 133 to enter the third photoelectric conversion element 30. The light transmitted through the wavelength-selective reflection film 53 enters a wavelength-selective reflection film 54, which transmits light having wavelengths longer than $\lambda_1$ in the second direction to allow the transmitted light 123 to enter the second photoelectric conversion element. The wavelength-selective reflection film 54 reflects light having wavelengths shorter than $\lambda_1$ in the first direction 1 to allow the reflected light 113 to enter the first photoelectric conversion element. In this configuration, UV light having wavelengths shorter than $\lambda_2$ is reflected in the third direction by the wavelength-selective reflection film 53. Thus, little UV light having wavelengths shorter than $\lambda_2$ enters the first photoelectric conversion element 10. This can improve the utilization efficiency of short-wavelength light to accordingly improve the conversion efficiency of the composite solar cell, and can, at the same time, suppress photodegradation of the first photoelectric conversion element 10.

In the configuration illustrated in FIG. 6, the third photoelectric conversion element 30, the first photoelectric conversion element 10, and the second photoelectric conversion element are disposed in this order from the light incident side. Although the positional order of the photoelectric conversion elements is not limited to the order of this configuration, disposing a photoelectric conversion element having a wider bandgap on the light incident side results in a reduced loss due to light absorption by the wavelength-selective reflection film, and therefore, higher conversion efficiency is likely to be achieved.

Although FIGS. 5 and 6 illustrate examples in which one or more wavelength-selective reflection films are used as the spectroscopic element, other types of optical element (such as a prism and a mirror) may be used to reduce the amount of UV light incident on the first photoelectric conversion element. The spectroscopic element may be configured to allow the UV light to enter the second photoelectric conversion element and/or the third photoelectric conversion element using an optical element other than a wavelength-selective reflection film. Even when one or more wavelength-selective reflection films are used, the arrangement of the wavelength-selective reflection film(s) and the arrangement of the photoelectric conversion elements are not limited to the illustrated arrangements. Various configurations may be employed depending on the wavelength selectivity of each spectroscopic element, the incident angle of light, and the like.

Figure 7:
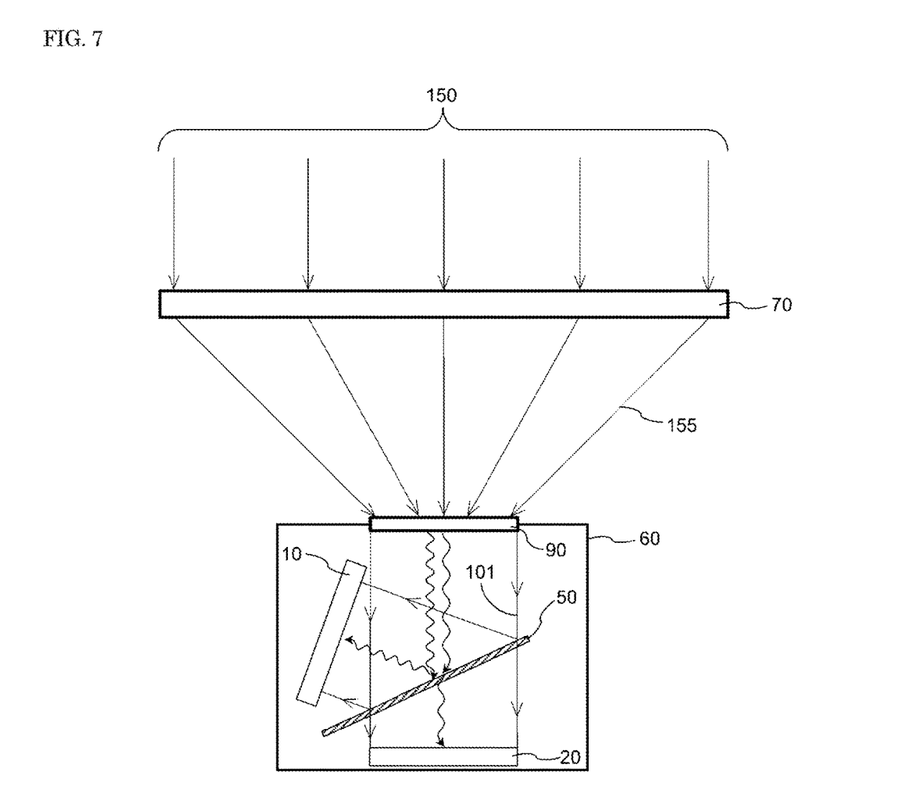
FIG. 7 is a schematic view illustrating a configuration of a concentrating solar cell according to one embodiment.

A composite solar cell according to the present invention is preferably modularized in practical use. Modularization may be performed in any suitable manner. For example, connecting leads to the electrodes of each photoelectric conversion element, and then encapsulating the photoelectric conversion elements provides modularization, and thus a solar cell module is produced. Since a composite solar cell according to the present invention utilizes reflection and/or refraction of the spectroscopic element, it is hard to arrange all of the optical elements on one flat plane. Thus, as shown in FIG. 7, the photoelectric conversion elements 10 and 20 and the spectroscopic element 50 are preferably encapsulated in an appropriate housing 60.

When the photoelectric conversion elements and the spectroscopic element are encapsulated in a housing, and if the housing is sealed so that no rainwater or the like will penetrate into the housing, not all the photoelectric conversion elements necessarily need to be sealed individually. However, since a perovskite crystal material is prone to degradation due to moisture etc., the perovskite-type photoelectric conversion element used as the first photoelectric conversion element is preferably more tightly sealed than the second photoelectric conversion element or similar elements. In other words, at least the first photoelectric conversion element is preferably sealed with a sealer, regardless of whether the photoelectric conversion elements and the spectroscopic element are encapsulated in a housing or not. Although the method for sealing the first photoelectric conversion element is not particularly limited, a method for sealing is preferably used that reduces or eliminates moisture penetration as much as possible, similarly to a case of sealing a typical organic EL element. The sealant used for sealing the first photoelectric conversion element preferably has a lower moisture permeability than the sealant used for sealing the second photoelectric conversion element and for sealing the housing.

Combining any composite solar cell according to the present invention with a light condensing element produces a concentrating solar cell. FIG. 7 is a schematic view of an example of the configuration of such a concentrating solar cell. A light condensing element 70 has a larger area than each of the photoelectric conversion elements. Sunlight 150 is condensed by the light condensing element 70, and is directed to the spectroscopic element of the composite solar cell. In this configuration, even a photoelectric conversion element having a small area can utilize a large amount of sunlight for photoelectric conversion. As the light condensing element 70, light condensing elements for use in a typical concentrating solar cell, such as a lens, a mirror, and a combination of a lens and a mirror can be used.

In a concentrating solar cell, a photoelectric conversion element having a small area receives a large amount of sunlight, and therefore the element temperature is likely to rise. In the present invention, a spectroscopic element imposes a limitation on the wavelength range of the light that is allowed to predominantly enter the first photoelectric conversion element (perovskite-type photoelectric conversion element). Thus, the concentrating solar cell also suppress a temperature rise of the perovskite-type photoelectric conversion element, thereby offers improvement in reliability.

A concentrating solar cell according to the present invention preferably includes a collimating element 90 between the light condensing element 70 and the spectroscopic element 50. The collimating element is not particularly limited as long as the collimating element outputs light 155 received from the light condensing element 70 toward the spectroscopic element 50 as collimated light. The collimating element 90 may be various types of lenses or mirrors, or a combination thereof. One specific example thereof is a collimator lens. Collimation provided by the collimating element needs not be as stringent as one that is required for a precision optical device or for an image display device.

The sunlight 150 is collimated light, while the light 155 condensed by the light condensing element 70 is non-collimated light. A composite solar cell according to the present invention, propagation direction of the light is wavelength-selectively changed by using the spectroscopic element 50, thereby controlling the wavelength range of the light that is allowed to predominantly enter each of the photoelectric conversion elements. When the light received by the spectroscopic element 50 is collimated light in a particular direction, the propagation direction of light output from the spectroscopic element is easily controllable. This permits light in a wavelength range as designed to predominantly enter a specific photoelectric conversion element, and thus enables high conversion characteristics to be maintained.

A composite solar cell according to the present invention can be capable of tracking the sun by combining with a suitable control system. A solar power system capable of tracking the sun is configured such that the light utilization efficiency is maximized depending on the incident direction of sunlight. For example, introducing a variable position, positioning angle, etc. of the spectroscopic element of the composite solar cell permits the incident angle θ to change depending on the change (seasonal and/or temporal change) of the incident direction of sunlight to allow a larger amount of short-wavelength light to enter the first photoelectric conversion element, and a larger amount of long-wavelength light to enter the second photoelectric conversion element. Furthermore, in a case of a concentrating solar cell, introducing a variable position and positioning angle of the light condensing element 70 permits the system to be configured such that a larger amount of sunlight enters the composite solar cell. In addition, the system may be configured to change the direction of the collimating element depending on the incident direction of sunlight to maintain the incident angle θ of the light received by the spectroscopic element at a constant value. Sun tracking capability of the entire system enables the incident angle and intensity of the sunlight incident on the composite solar cell to be optimized.

EXAMPLES

The present invention will be described more specifically with reference to examples. It is to be noted that examples are not intended to limit the present invention.

In the examples, the first photoelectric conversion element was a perovskite-type photoelectric conversion element (hereinafter referred to as "perovskite cell") including a $TiO_2$ compact layer, a light absorbing layer containing a perovskite crystalline material $CH_3NH_3PbI_3$ formed on mesoporous $TiO_2$, a hole transport layer, and a Au electrode, sequentially stacked on a transparent substrate. The long-wavelength edge of the spectral sensitivity curve of this perovskite cell was at a wavelength of 800 nm.

The second photoelectric conversion element was a crystalline silicon photoelectric conversion element (hereinafter referred to as "crystalline silicon cell") having a heterojunction structure, including an i-type amorphous silicon thin-film, a p-type amorphous silicon thin-film, and an ITO transparent electrode layer, sequentially stacked on the light incident surface of an n-type single-crystalline silicon substrate having a textured structure; and an i-type amorphous silicon thin-film, an n-type amorphous silicon thin-film, and an ITO transparent electrode layer, sequentially stacked on the back side of the n-type single-crystalline silicon substrate.

TABLE 1 summarizes the results of measuring conversion characteristics by illuminating each of the photoelectric conversion elements with 1-sun intensity (AM 1.5 G, 100 $mW/cm^2$) light using a solar simulator.

TABLE 1

|  | Jsc (mA/cm$^2$) | Voc (V) | FF (%) | Eff (%) |
| --- | --- | --- | --- | --- |
| perovskite | 18.24 | 0.974 | 60.12 | 10.68 |
| crystalline silicon | 39.23 | 0.728 | 77.86 | 22.24 |

Experimental Example 1

Composite solar cells each having the configuration shown in FIG. 1 were prepared using the perovskite cell described above as the first photoelectric conversion element 10, and the crystalline silicon cell described above as the second photoelectric conversion element 20. The wavelength-selective reflection films 51 had long-wavelength separation wavelengths $\lambda_1$ of 700 nm (Experimental Example 1-1), 640 nm (Experimental Example 1-2), 600 nm (Experimental Example 1-3), and 550 nm (Experimental Example 1-4), respectively. Each of the wavelength-selective reflection films was a vapor-deposited multilayer film including high refractive index material layers and low refractive index material layers alternately stacked on a glass substrate.

In this experimental example, the angle between the light receiving surfaces of the first photoelectric conversion element and the second photoelectric conversion element was set to 90°, and the angles between the light receiving surfaces of these photoelectric conversion elements and the film surface of the wavelength-selective reflection film 52 were each set to 45°. In the measurement of conversion characteristics, the incident angle θ of the light incident on the wavelength-selective reflection film 52 was set to 45°. TABLE 2 shows the conversion characteristics of the perovskite cell and the crystalline silicon cell, as well as the sums of conversion efficiencies (Eff) of both cells. Note that the separation wavelengths $\lambda_1$ and $\lambda_2$ of the wavelength-selective reflection film are wavelengths at which the magnitude relation between reflectance and transmittance of incident light at an incident angle of 45° is reversed. In other words, the reflectance is higher than the transmittance (i.e., light is reflected toward the perovskite cell) when the wavelength is in a range from $\lambda_2$ to $\lambda_1$, while the transmittance is higher than the reflectance (i.e., light is transmitted toward the crystalline silicon cell) in a region of wavelength shorter than the wavelength $\lambda_2$, and in a region of wavelength longer than the wavelength $\lambda_1$.

(wavelength range of light output predominantly toward perovskite cell (first photoelectric conversion element)) enables a high-efficiency composite solar cell to be obtained.

Reference Example 1: Estimation of Amount of Heat in Perovskite Cell

Figure 9:
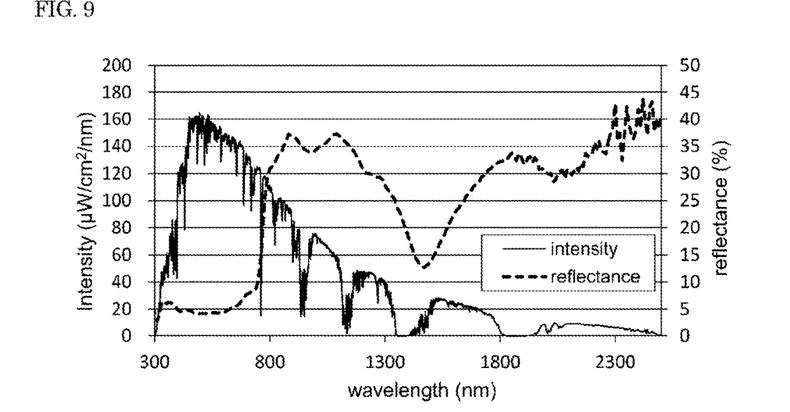
FIG. 9 shows a spectrum of sunlight at AM 1.5 G and a reflectance spectrum of the perovskite-type photoelectric conversion element used in the example.

The amount of heat generated in a perovskite cell was estimated as described below under a condition in which the wavelength range of light incident on the perovskite cell was limited using a wavelength-selective reflection film etc. FIG. 9 shows a spectrum of sunlight at AM 1.5 G and a reflectance spectrum of the perovskite cell. The reflectance was measured using a spectrophotometer by illuminating the light incident surface of the perovskite cell with measurement light.

Conversion efficiency of the perovskite cell was measured when the perovskite cell was illuminated with 1-sun intensity all-wavelength light (wavelength range: 280 nm to 2500 nm) (Reference Example 1-1: substantially the same as the measurement of the perovskite cell of TABLE 1 shown above), and when long-wavelength light was filtered out using a wavelength cutoff filter (Reference Examples 1-2 to 1-6).

The illumination energy is the energy of illumination light within the illumination wavelength range, and was calculated based on the AM 1.5 G sunlight spectrum. The amount of power generated by a perovskite cell was calculated from the product of the conversion efficiency and the illumination energy of all-wavelength light (99.26 mW/cm²). The effective conversion efficiency was calculated from the ratio of

TABLE 2

| | separation wavelength (nm) | | crystalline silicon | | | | perovskite | | | | total Eff |
|---|---|---|---|---|---|---|---|---|---|---|---|
| | $\lambda_2$ | $\lambda_1$ | Jsc (mA/cm²) | Voc (V) | FF (%) | Eff (%) | Jsc (mA/cm²) | Voc (V) | FF (%) | Eff (%) | (%) |
| Example 1-1 | 300 | 700 | 22.51 | 0.718 | 79.01 | 12.77 | 16.20 | 0.959 | 61.30 | 9.52 | 22.29 |
| Example 1-2 | 300 | 640 | 25.41 | 0.722 | 78.97 | 14.49 | 14.57 | 0.950 | 61.82 | 8.56 | 23.05 |
| Example 1-3 | 300 | 600 | 27.58 | 0.728 | 78.94 | 15.85 | 13.40 | 0.952 | 62.61 | 7.99 | 23.84 |
| Example 1-4 | 330 | 550 | 32.34 | 0.731 | 78.49 | 18.50 | 10.38 | 0.960 | 61.91 | 6.17 | 24.67 |

In Experimental Example 1-1, the separation wavelength $\lambda_1$ was set to a value that is 100 nm shorter (0.22 eV higher in energy) than the long-wavelength edge of the spectral sensitivity curve of the perovskite cell. However, the sum of the conversion efficiencies of the perovskite cell and the crystalline silicon cell was substantially the same as the conversion efficiency of the crystalline silicon cell used solely. In contrast, Experimental Examples 1-2 to 1-4, in which each of the wavelength-selective reflection films had a separation wavelength $\lambda_1$ that is 0.3 eV or more higher in energy than the long-wavelength edge of the spectral sensitivity curve of the perovskite cell, showed that the sums of the conversion efficiencies significantly improved as compared to the case where the crystalline silicon cell was used solely. These results have demonstrated that adjusting the separation wavelength provided by spectroscopic means the amount of generated power to the illumination energy. The energy of reflected light was calculated from the product of the intensity (light energy) of AM 1.5 G sunlight and the reflectance at each wavelength.

Assuming that the remainder after subtraction of both the energy converted to electricity by the perovskite cell (amount of generated power) and the energy dissipated by reflection (energy of reflected light) from the total energy of light in the wavelength range incident on the perovskite cell will be stored in the perovskite cell as thermal energy, the thermal energy that would be stored in the perovskite cell was calculated using the formula shown below:

(Thermal energy)=(Illumination energy)−(Amount of generated power)−(Energy of reflected light)

TABLE 3 summarizes the results of calculation.

TABLE 3

| | illumination wavelength range | illumination energy (mW/cm$^2$) | conversion efficiency (%) | power generation (mW/cm$^2$) | effective conversion efficiency (%) | reflected-light energy (mW/cm$^2$) | thermal energy (mW/cm$^2$) |
|---|---|---|---|---|---|---|---|
| Reference Example 1-1 | all-wavelength light (280-2500 nm) | 99.26 | 10.68 | 10.60 | 10.68 | 16.87 | 71.78 |
| Reference Example 1-2 | 280-550 nm | 26.13 | 6.17 | 6.12 | 23.44 | 1.22 | 18.79 |
| Reference Example 1-3 | 280-600 nm | 33.59 | 7.99 | 7.93 | 23.61 | 1.54 | 24.12 |
| Reference Example 1-4 | 280-640 nm | 39.38 | 8.56 | 8.50 | 21.58 | 1.83 | 29.06 |
| Reference Example 1-5 | 280-700 nm | 47.53 | 9.52 | 9.45 | 19.88 | 2.34 | 35.74 |
| Reference Example 1-6 | 280-800 nm | 58.86 | 10.68 | 10.60 | 18.01 | 4.03 | 44.23 |

As shown in TABLE 3, when the perovskite cell is illuminated with all-wavelength light with 1-sun intensity, about 71% of the energy of the illumination light is stored in the perovskite cell as thermal energy (Reference Example 1-1). In contrast, preventing light having wavelengths greater than 800 nm from entering the perovskite cell reduces the stored thermal energy to as low as about 44% (Reference Example 1-6); and preventing light having wavelengths greater than 550 nm from entering the perovskite cell reduces this thermal energy to below 20% (Reference Example 1-2). It is also shown that limiting the wavelength range of light that enters the perovskite cell can improve the effective conversion efficiency (ratio of the amount of generated power to the actual energy of illumination light).

The results shown above indicate that limiting the wavelength range of light allowed to enter the perovskite cell can improve the utilization efficiency of light, and can, at the same time, reduce the amount of heat stored in the perovskite cell, which, in turn, reduces degradation due to temperature rise (thermal degradation) of the cell. The composite solar cell of Experimental Example 1-4 (TABLE 2) configured to receive light having wavelengths shorter than about 550 nm, which is shorter than the long-wavelength edge (800 nm) of the spectral sensitivity curve of the perovskite cell, has a high conversion efficiency, and moreover, the amount of stored heat is reduced to about one quarter of that stored by the illumination with all-wavelength light. This is thought to permit reduction in thermal degradation of the perovskite cell, and thus enable long-term reliability to be ensured.

Reference Example 2: Effect of UV Light on Perovskite Cell

A UV cutoff filter for absorbing light having wavelengths shorter than $\lambda_2$ was provided on a surface of the perovskite cell, and illumination was performed with 1-sun intensity light for 1 hour using a solar simulator. Changes in the conversion characteristics before and after the illumination are shown in TABLE 4. The values shown in TABLE 4 are relative values with respect to the values before illumination, which are defined as 1. The values for Reference Example 2-4 are the results of performing a similar test without using a UV cutoff filter.

TABLE 4

| | $\lambda_2$ (nm) | Jsc | Voc | FF | Eff |
|---|---|---|---|---|---|
| Reference Example 2-1 | 370 | 0.96 | 1.01 | 1.00 | 0.97 |
| Reference Example 2-2 | 340 | 0.95 | 1.01 | 1.00 | 0.97 |
| Reference Example 2-3 | 310 | 0.92 | 1.02 | 1.01 | 0.94 |
| Reference Example 2-4 | — | 0.91 | 1.02 | 1.01 | 0.94 |

The results shown in TABLE 4 confirm that light illumination reduces conversion characteristics (in particular, $J_{SC}$) of the perovskite cell. These results show, among others, a high degree of degradation in characteristics due to UV light having wavelengths of 320 nm or shorter. This is thought to be due to photodegradation of compounds by UV light, effect of heat not involved in photoelectric conversion, and/or the like.

Experimental Example 2

In Experimental Example 2, composite solar cells were prepared using two different wavelength-selective reflection films having a same long-wavelength separation wavelength $\lambda_1$ of 550 nm, and having different short-wavelength separation wavelengths $\lambda_2$, similarly to Experimental Example 1. After measuring conversion characteristics of the prepared composite solar cells using a solar simulator, illumination was performed with 1-sun intensity light for 1 hour, and the conversion characteristics after the illumination were then determined similarly to Reference Example 2 as described above. The results are shown in TABLE 5. The values of conversion characteristics after illumination shown in the lower rows are relative values with respect to the values before illumination, which are defined as 1.

TABLE 5

| | initial properties | | | | | | | | | |
|---|---|---|---|---|---|---|---|---|---|---|
| | separation wavelength (nm) | | crystalline silicon | | | | perovskite | | | |
| | $\lambda_2$ | $\lambda_1$ | Jsc (mA/cm$^2$) | Voc (V) | FF (%) | Eff (%) | Jsc (mA/cm$^2$) | Voc (V) | FF (%) | Eff (%) | total Eff (%) |
| Experimental Example 2-1 | 330 | 550 | 32.26 | 0.733 | 78.35 | 18.53 | 10.32 | 0.955 | 61.51 | 6.06 | 24.59 |
| Experimental Example 2-2 | 300 | 550 | 31.95 | 0.732 | 78.41 | 18.34 | 10.39 | 0.966 | 60.85 | 6.11 | 24.45 |

| | after light illumination | | | | |
|---|---|---|---|---|---|
| | perovskite | | | | |
| | Jsc (mA/cm$^2$) | Voc (V) | FF (%) | Eff (%) | total Eff (%) |
| Experimental Example 2-1 | 9.80 | 0.965 | 61.51 | 5.82 | 24.35 |
| | 0.95 | 1.01 | 1.00 | 0.96 | — |
| Experimental Example 2-2 | 9.66 | 0.976 | 60.85 | 5.74 | 24.08 |
| | 0.93 | 1.01 | 1.00 | 0.94 | — |

In Experimental Example 2-1, most of the light having wavelengths in a range from 300 nm to 320 nm enters the crystalline silicon cell. Thus, the degradation of characteristics after the light illumination as compared to before the light illumination is smaller than the degradation observed in Experimental Example 2-2. Experimental Example 2-1 also exhibited higher initial conversion efficiency and higher conversion efficiency after the light illumination. These results show that allowing light having wavelengths from 300 nm to 320 nm to predominantly enter the crystalline silicon cell provides a composite solar cell having excellent initial conversion characteristics as well as excellent conversion characteristics after light illumination (reliability).

DESCRIPTION OF REFERENCE CHARACTERS 10 photoelectric conversion element (perovskite-type photoelectric conversion element)
20, 30 photoelectric conversion element
51, 52, 53, 54 spectroscopic element (wavelength-selective reflection film)
58 spectroscopic element (prism)
59 composite spectroscopic element
60 housing
70 light condensing element
90 collimating element

The invention claimed is:

1. A composite solar cell comprising: a spectroscopic element; a first photoelectric conversion element provided at a position facing a first side of the spectroscopic element; and a second photoelectric conversion element provided at a position facing a second side of the spectroscopic element, wherein
the first photoelectric conversion element is a perovskite-type photoelectric conversion element containing, in a light absorbing layer, a photosensitive material having a perovskite crystal structure represented by a general formula $R^1NH_3M^1X_3$, wherein $R^1$ is an alkyl group, $M^1$ is a divalent metal ion, and X is a halogen,
an amount of light energy corresponding to a long-wavelength edge of a spectral sensitivity curve for the light absorbing layer of the first photoelectric conversion element is $E_1$ eV,
of an incident light received from a light incident side, the spectroscopic element outputs short-wavelength light having an energy of $(E_1+0.9)$ eV or more predominantly from the first side, and outputs long-wavelength light having an energy of $(E_1+0.3)$ eV or less predominantly from the second side,
the spectroscopic element includes a wavelength-selective reflection film,
the wavelength-selective reflection film is configured to predominantly transmit long-wavelength light having the energy of $(E_1+0.3)$ eV or less and predominantly reflect short-wavelength light having the energy of $(E_1+0.9)$ eV or more, and
the composite solar cell is configured such that the incident light enters the wavelength-selective reflection film at an incident angle of greater than 5° and 40° or less with respect to a normal direction of a wavelength-selective reflection film surface.

2. The composite solar cell according to claim 1, wherein the light absorbing layer of the second photoelectric conversion element is made of crystalline silicon.

3. The composite solar cell according to claim 2, wherein the spectroscopic element is configured such that UV light having a wavelength from 300 nm to 320 nm, of the incident light, is output predominantly facing the second side.

4. The composite solar cell according to claim 2, further comprising a third photoelectric conversion element provided at a position in a third direction of the spectroscopic element, wherein
the spectroscopic element is configured such that UV light having a wavelength from 300 nm to 320 nm, of the incident light, is output predominantly in the third direction.

5. A solar cell module comprising of the composite solar cell according to claim 1, wherein at least the first photoelectric conversion element is encapsulated.

6. A concentrating solar cell comprising:
the composite solar cell according to claim 1; and
a light condensing element provided at a position on the light incident side of the spectroscopic element of the composite solar cell.

7. The concentrating solar cell according to claim 6, further comprising a collimating element between the spectroscopic element and the light condensing element.

8. The composite solar cell according to claim 1, wherein the composite solar cell is configured such that the incident light enters the wavelength-selective reflection film at an incident angle of 10° or more.

9. The composite solar cell according to claim 8, wherein the composite solar cell is configured such that the incident light enters the wavelength-selective reflection film at an incident angle of 30° or less.

10. The composite solar cell according to claim 8, wherein the composite solar cell is configured such that the incident light enters the wavelength-selective reflection film at an incident angle of 25° or less.

11. A composite solar cell comprising: a spectroscopic element; a first photoelectric conversion element provided at a position facing a first side of the spectroscopic element; and a second photoelectric conversion element provided at a position facing a second side of the spectroscopic element, wherein
the first photoelectric conversion element is a perovskite-type photoelectric conversion element containing, in a light absorbing layer, a photosensitive material having a perovskite crystal structure represented by a general formula $R^1NH_3M^1X_3$, wherein $R^1$ is an alkyl group, $M^1$ is a divalent metal ion, and X is a halogen,
a long-wavelength edge of a spectral sensitivity curve of the light absorbing layer of the first photoelectric conversion element is in a range from 750 nm to 850 nm,
a light absorbing layer of the second photoelectric conversion element has a bandgap that is narrower than a bandgap of the light absorbing layer of the first photoelectric conversion element,
of an incident light from a light incident side, the spectroscopic element outputs short-wavelength light having a wavelength of 500 nm or shorter predominantly from the first side, and outputs long-wavelength light having a wavelength of 650 nm or longer predominantly from the second side,
the spectroscopic element includes a wavelength-selective reflection film,
the wavelength-selective reflection film is configured to predominantly transmit long-wavelength light having the wavelength of 650 nm or longer and predominantly reflect short-wavelength light having the wavelength of 500 nm or shorter, and
the composite solar cell is configured such that the incident light enters the wavelength-selective reflection film at an incident angle of greater than 5° and 40° or less with respect to a normal direction of a wavelength-selective reflection film surface.

12. The composite solar cell according to claim 11, wherein the light absorbing layer of the second photoelectric conversion element is made of crystalline silicon.

13. The composite solar cell according to claim 11, wherein the composite solar cell is configured such that the incident light enters the wavelength-selective reflection film at an incident angle of 10° or more.

14. The composite solar cell according to claim 13, wherein the composite solar cell is configured such that the incident light enters the wavelength-selective reflection film at an incident angle of 30° or less.

15. The composite solar cell according to claim 13, wherein the composite solar cell is configured such that the incident light enters the wavelength-selective reflection film at an incident angle of 25° or less.

\* \* \* \* \*